United States Patent [19]

Knapp

[11] 4,275,316
[45] Jun. 23, 1981

[54] RESETTABLE BISTABLE CIRCUIT

[75] Inventor: William K. Knapp, Hillsboro, N.J.

[73] Assignee: RCA Corporation, New York, N.Y.

[21] Appl. No.: 958,020

[22] Filed: Nov. 6, 1978

[51] Int. Cl.³ .................. H03K 3/286; H03K 3/353
[52] U.S. Cl. ............................ 307/279; 307/221 C;
307/225 C; 307/451
[58] Field of Search .......... 307/289, 290, 291, 220 C,
307/221 C, 222 C, 223 C, 225 C, 279

[56] References Cited

U.S. PATENT DOCUMENTS

| 3,829,712 | 8/1974 | Hama | 307/225 C |
| 3,964,031 | 6/1976 | Eaton, Jr. | 307/279 |
| 4,057,741 | 11/1977 | Piquet | 307/279 |
| 4,101,790 | 7/1978 | Ebihara et al. | 307/221 C |

OTHER PUBLICATIONS

Digital Integrated Circuits, CD4060B, RCA File No. 1120, RCA Solid State Division, pp. 1-3, 8/78.

Primary Examiner—Stanley D. Miller, Jr.
Assistant Examiner—B. P. Davis
Attorney, Agent, or Firm—E. M. Whitacre; P. J. Rasmussen; E. P. Herrmann

[57] ABSTRACT

A resettable D type flip flop for integrated circuit counter circuits, which flip flop comprises master and slave flip flop stages. The slave flip flop stage includes NOR and an INVERTER circuit selectively coupled via a first transmission gate to form a latch or via a second transmission gate to accept new data. The master flip flop stage having an output terminal coupled to apply signal to the slave includes a NOR circuit having an input and its output terminals directly connected to the output and input terminals respectively of a second INVERTER circuit. The NOR is selectively energized to complete a latch circuit or inactivated to permit input data to be applied to an interconnection at its output terminal via a third inverter having an input connected to a DATA input terminal for receiving input signal and which third INVERTER is selectively energized to render it alternately active and inactive.

4 Claims, 3 Drawing Figures

RESETTABLE BISTABLE CIRCUIT

This invention relates to improvements in digital bistable circuits which can be asynchronously reset and in particular to data or "D" type flip flop circuits.

A commonly used circuit of this type includes master and slave flip flop stages, each comprising a latch connection of complementary metal-oxide-semiconductor (CMOS) field effect transistors (FET's). Information or data is sequentially accepted from a data input terminal via a transmission gate and applied to the master stage by a clocked signal, then shifted to the slave stage by the complement of the clocked signal via a further transmission gate, the data and its complement in the slave stage being available as output signals at complementary output terminals. Such circuits are capable of storing information over time and are commonly employed in watch circuits, for example, as counters or dividers for successively halving a particular oscillator frequency simply by applying the complement of the output signal to the data input terminal. In this condition the circuit alternately clocks information from the output of each stage to the input of the other through a respective clocked transmission gate and produces a square wave output signal at one-half the clock repetition rate. The low frequency signals produced in such a manner are used to control the electro-optic display devices of the watch, e.g., light emitting diodes or of liquid crystal cells of the watch.

Asynchronous resetting of such stages is desired for the purpose of automatic time correction systems, for example, wherein the counter in the watch circuit is instantaneously reset at the occurrence of a correction signal. Asynchronous resetting is achieved in the prior art by including a NOR circuit within the latch of both master and slave stages and simultaneously applying a reset signal to respective inputs of both NOR circuits forcing both master and slave stages into determinable logic states.

D type flip flops used in watch circuits and having asynchronous reset capability typically include a master stage followed in cascade connection by a slave stage each being formed of two types of signal inverting circuits, i.e., a NOR gate and an INVERTER. During one time phase of operation a clocked transmission gate connects the latter of these cascaded stages to the former to complete a regenerative feedback loop, conditioning them to latch in a stable state. During another timing phase of operation, a second clocked transmission gate applies an input signal to the former of these cascaded stages for updating data to be stored in them.

The master flip flop stage in the present invention has a NOR and INVERTER directly coupled in a regenerative feedback connection but the NOR is selectively energized under the control of a clocked signal rendering it alternately active and inactive. The NOR and INVERTER circuit are selectively connected to the data input terminal via a further INVERTER which is also selectively energized at times alternate to the NOR circuit being active. This further INVERTER in the master stage renders the output signal of the D flip flop circuit complementary to the data input. The particular circuit configuration lends itself to high density integrated circuit fabrication as the interconnections are particularly symmetric and require a minimum of monolithic die area. Economies in die area translate to circuits having higher circuit yield and greater reliability.

Figure 1:
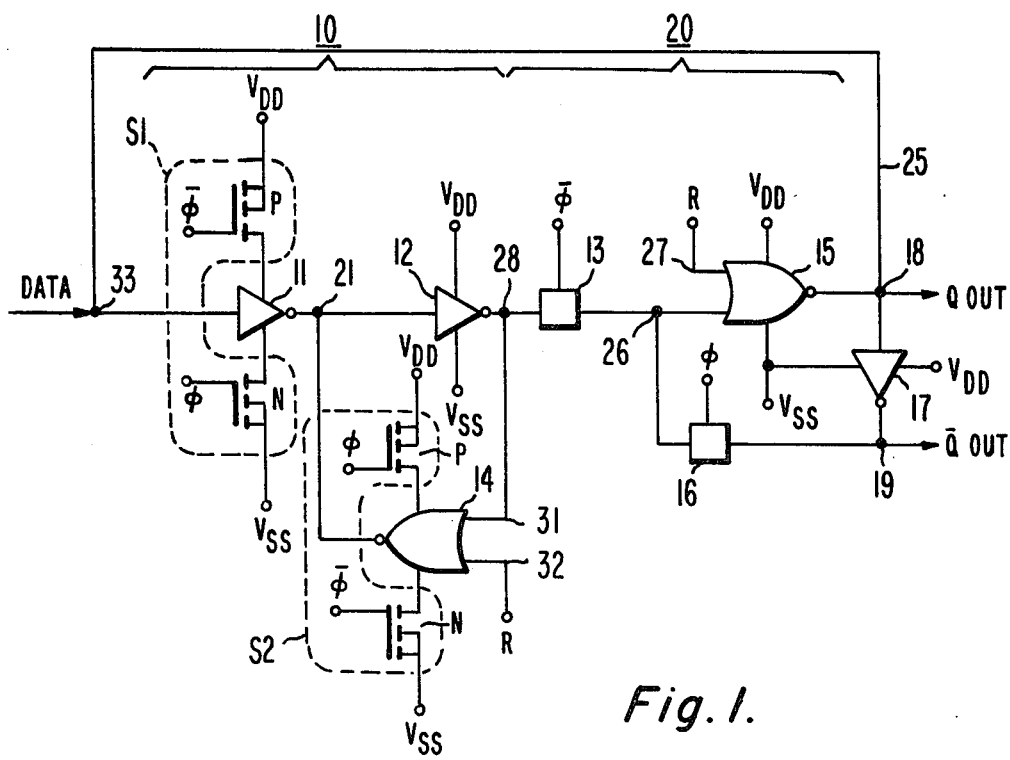
FIG. 1 is a logical representation of the invention connected as a toggle type binary divider.
Figure 2:
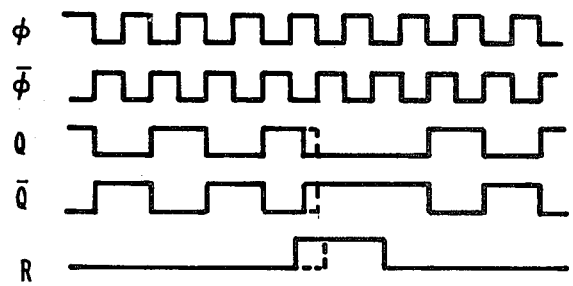
FIG. 2 is a voltage-time diagram for the circuit of FIG. 1.

The FIG. 1 D-type flip flop includes master flip flop stage 10, selectively coupled to slave flip flop stage 20 inclusive of transmission gate 13 and having complementary output terminals 18 and 19 and a DATA input terminal 33. Feedback connection 25 coupled from output 18 to DATA input terminal 33 configures the D flip flop as a toggle type binary frequency divider having asynchronous reset capability via a reset connection designated R. (Flip flop stages 10 and 20 will hereafter be referred to simply as FF10 and FF20). Complementary output signals Q and $\bar{Q}$ are available at nodes 18 and 19 respectively which signals are square waves at a frequency that is one-half the frequency of applied complementary clock signals $\phi$ and $\bar{\phi}$, assuming $\phi$ to be a continuous repetitive wave form such as is indicated in the FIG. 2 timing diagram. The duty cycle of the clock waveform does not effect the duty cycle of the output waveform.

Slave flip flop 20 comprises NOR circuit 15 (hereafter, simply NOR 15) having input nodes 26 and 27 and having an output terminal 18 which is coupled to the input electrode of a first logical INVERTER circuit 17. The output electrode of INVERTER 17 is selectively connected to input node 26 of NOR 15 via transmission gate 16 controlled by the clocked potential $\phi$.

For the condition that the reset signal R on input 27 is low, and transmission gate 16 is closed, INVERTER 17 provides regenerative feedback around NOR 15 to maintain its output in a constant logic state. This state is held for the duration of the $\phi$ clock pulse, unless the output is in a high state and a high reset is applied, in which case the output will change immediately following application of reset to a low state.

Simultaneous with the $\phi$ clock going to a low state, the $\bar{\phi}$ clock goes to a high state opening the conduction path of transmission gate 16 between nodes 19 and 26 and completing the conduction path of transmission gate 13 between nodes 28 and 26. The logical state of NOR 15 is now controlled by the logical state present at node 28 which node is the output terminal of master flip-flop 10. Slave flip flop 20 is said to be subordinate to the FF10 under this set of conditions.

INVERTER 17 complements the logical signal present at the output terminal 18 of the FF20 providing a complementary output $\bar{Q}$ available at node 19 in addition to providing the regenerative feedback for NOR 15.

FF10 includes NOR circuit 14 and INVERTER circuits 11 and 12. Signal applied to DATA input terminal 33 is complemented by INVERTER 11 and selectively applied to node 21.

INVERTER 11 is selectively connected to supply potentials $V_{DD}$ and $V_{SS}$ via switches S1 which are closed (i.e., conductive) when the $\phi$ clock is high. These switches may, for example, comprise complementary conductivity FET's clocked in anti-phase, as shown. In the condition where switches S1 are conductive INVERTER 11 is active and operates in the conventional manner. Opening switches S1 causes the output of 11 to exhibit a high impedance condition, in effect disconnecting its output from the circuit.

INVERTER 12 is continuously energized having its output terminal connected to output terminal 28 of FF10 and further connected to NOR 14 input terminal 31. For the condition of INVERTER 11 energized, logical signal applied to DATA input 33 is twice complemented by INVERTERS 11 and 12 and provided in its true state at output 28 of FF10.

NOR 14 is similar to NOR 15 in operation; however, NOR 14 is selectively energized under the control of the $\bar{\phi}$ clock, i.e., NOR 14 is connected to supply potentials $V_{DD}$ and $V_{SS}$ via switches S2 when $\bar{\phi}$ is in a high state. Switches S2, like switches S1 may, for example, comprise complementary conductivity FET's clocked in anti-phase, as shown. In the energized condition NOR 14 completes a regenerative feedback loop around INVERTER 12, conditioning FF10 to maintain a stable logical state subject to the signal on reset. Opening switches S2 causes the output of NOR 14 to exhibit a high impedance, in effect disconnecting its output terminal from the circuit.

INVERTER 11 and NOR 14 are energized in the alternative. INVERTER 11, when active, complements the signal at the DATA input and establishes or updates the state of FF10. Subsequent to INVERTER 11 being inactivated, NOR 14 is energized to close the feedback loop and the updated data is latched in the master stage. During the transition from INVERTER 11 active to NOR 14 being active the logical states are retained unchanged by means of charge storage of inherent device capacitances.

Simultaneous with INVERTER 11 being inactive, transmission gate 13 conducts. The output of FF10 is applied to node 26 of FF20, and the slave is subordinated to the logic state of the master stage.

NOR 14 and NOR 15 have respective input nodes 32 and 27 connected for receiving logical reset signals R. The reset is normally a logical low, permitting NOR 14 and NOR 15 to respond to signals on their respective second inputs at nodes 31 and 26. Application of a high reset pulse forces the outputs of both NOR circuits to a logical low when the $\bar{\phi}$ clock is high. In either case the output transition to the low state will occur immediately upon applying reset.

Assuming transmission gate 16 is closed, i.e., 100 is high, and a reset pulse is applied, node 18 goes low and node 19 high. The logical high state at node 19 is fed back through transmission gate 16 to node 26, which state will maintain the output of NOR 15 low if reset is removed, at least until the next positive-going transition of the $\phi$ clock.

In summary, upon application of a high $\phi$ clock signal, FF20 is isolated from the output of FF10 and latched in a stable state. FF10 is on the other hand being updated by signal present at DATA input 33. When the clocks change state, $\phi$-low and $\bar{\phi}$-high, FF10 is isolated from DATA and is latched in the state present at DATA input immediately prior to the clock transition. FF20 is subordinated to and receives data from FF10. The cycle then repeats.

The connection from output terminals 18 to DATA input 33 configures the circuit as a binary divider which operates as a typical ripple counter in a manner analogous to that known in the art.

Figure 3:
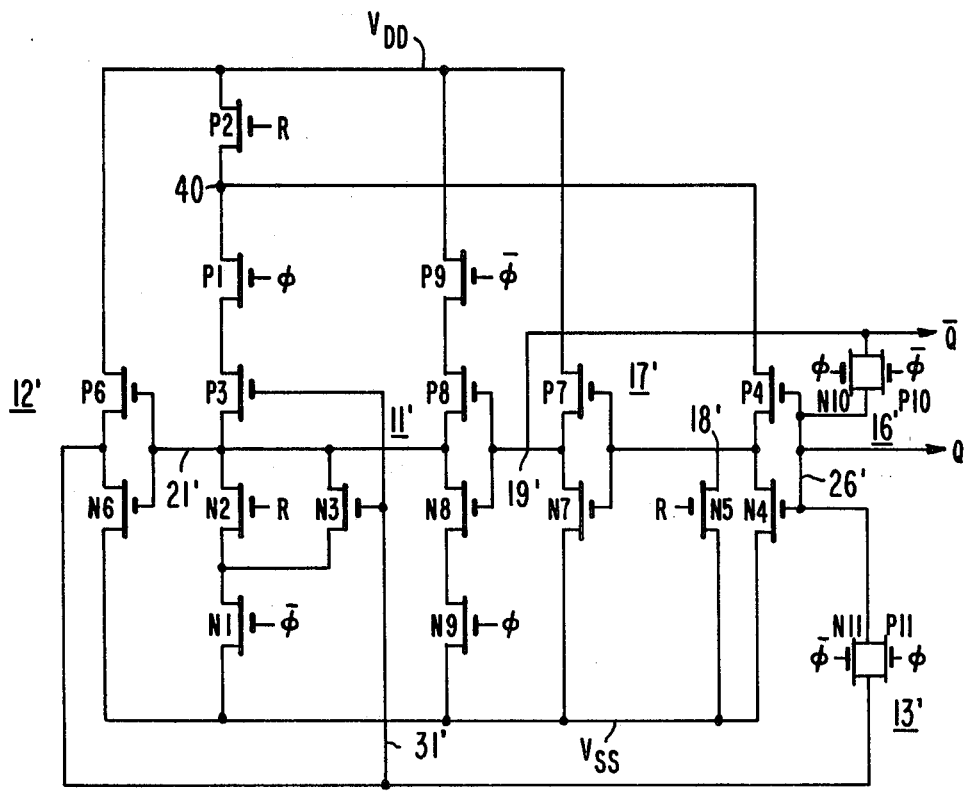
FIG. 3 is a detailed circuit schematic of an embodiment of the invention shown in FIG. 1.

FIG. 3 is a schematic of an embodiment of the functional schematic of FIG. 1 wherein the primed numbers designate the elements of FIG. 3 which correspond to similarly numbered functional elements in FIG. 1. The circuit shown in designed in complementary symmetry field effect transistor (FET) technology utilizing-p-channel and n-channel enhancement mode transistors, but is not limited to this technology.

The p-channel FET's are arranged to conduct for a low potential, i.e., a logic low, applied to their gate or control electrodes and the n-channel FET's are arranged to conduct for a logical high applied to their gate or control electrodes. INVERTERS 12' and 17' formed respectively by transistors P6, N6 and P7, N7 are conventional complementary FET inverter circuits well known in the art. INVERTER circuit 11' is comprised of transistors P8 and N8 and operates similar to INVERTERS 12' and 17' with the exception that it selectively has supply potential applied through the switch means comprising transistors P9 and N9. P9 and N9, controlled by complementary clocks, simultaneously conduct to provide a current path between $V_{DD}$ and $V_{SS}$, or are simultaneously non-conducting isolating P8 and N8 from both $V_{DD}$ and $V_{SS}$. Transistors P9 and N9 having respectively $\bar{\phi}$ and $\phi$ clocks applied to their gate electrodes conduct when $\phi$ is high, conditioning INVERTER 11' to be active when $\phi$ is high.

Transmission gates 13' and 16' constructed with respective complementary transistor pairs P10, N10 and P11, N11 and controlled by complementary clocks $\phi$ and $\bar{\phi}$ conduct in the alternative. The transmission gates are shown as complementary transistor pairs but each may be comprised of a single transistor which if chosen complementary to each other could be driven by the same clock phase.

Transistors P2, P4, N4 and N5 provide the function of NOR 15. A first input node 26' is connected to apply logic signal to the gate electrode of P4 and N4 and a second input R is connected to apply logical reset potential to the gate electrodes of P2 and N5. An output signal is available at node 18'. The output potential is a logical high only for the condition that transistors P2 and P4 conduct to provide a connection to supply $V_{DD}$ and simultaneously that transistors N4 and N5 be non-conducting. A logically low potential applied to node 26' puts P4 in and N4 out of conduction due to the complementary characteristics of the two devices. Similarly a logic low applied to the R inputs puts P2 into and N5 out of conduction. The conduction paths of P2 and P4 connect node 18' to supply $V_{DD}$ and simultaneously N2 and N4 isolate it from reference $V_{SS}$ enabling node 18' to attain a potential substantially equal to $V_{DD}$ or a logic high. Conversely, a logic high on either R or node 26 turns off P2 (P4) isolating node 18' from $V_{DD}$ and turning on N5 (N4) connecting node 18' to reference potential $V_{SS}$ or logic low potential.

Transistors P2, P3, N2 and N3 provide the function of NOR 14. However, NOR 14 is active only when the composite arrangement of transistors P2, P3, N2 and N3 are connected between supply potentials $V_{DD}$ $V_{SS}$ conditioned by the switch means S2 comprising transistors $P_1$ and $N_1$ simultaneously conducting. $P_1$ and $N_1$ are controlled by complementary clocks $\phi$ and $\bar{\phi}$ applied to their respective gate electrodes to effect this condition.

Transistor P2 shared by both NOR circuits reduces the device count but does not alter the functional operation of the NOR circuits.

Considering the FIG. 3 circuit in terms of the logic gates indicated for the respective composite arrangements of transistors, i.e., 11', 12', 13', etc., the operation of the FIG. 3 circuit is identical to the foregoing description for the FIG. 1 circuit.

A further embodiment of the invention includes an additional p-channel transistor connected between transistor P4 and $V_{DD}$ with connecting link 41 eliminated. Such an embodiment results in two independent NOR circuits.

Armed with the foregoing, one skilled in the art will be able to construe various deviations of the disclosed invention without straying from the spirit of the invention. For example, while the switch means are shown as FET's they may alternatively be bipolar devices.

What I claim is:

1. A resettable bistable circuit comprising:

first and second terminals for applying energizing potential thereto;

a third terminal for applying reset signal thereto;

a fourth terminal for receiving input signal;

first, second and third logical INVERTER circuits each having an input and an output terminal, and first and second supply terminals for applying respective relatively positive and relatively negative potentials thereto;

first and second NOR circuits each having first and second input terminals, on output terminal, and first and second supply terminals for applying respective relatively positive and relatively negative potentials thereto;

first and second transmission gates each having first and second input-output terminals and a control terminal;

means connecting the respective first supply terminals of the first NOR and first and second INVERTER circuits to said first terminal without substantially intervening impedance; means connecting the respective second supply terminals of the first NOR and first and second INVERTER circuits to said second terminal without substantial intervening impedance;

means connecting the first input-output terminals of the first and second transmission gates to the first input of the first NOR circuit;

means connecting the second input-output terminals of the first and second transmission gates to the output terminal of said first and second INVERTER circuits respectively;

means connecting the output terminals of the first and second NOR circuits to the respective input terminals of the first and second INVERTER circuits;

means connecting the input and output terminals of the third INVERTER circuit respectively to the fourth terminal and the input terminal of the second INVERTER circuit;

means connecting the output terminal of the second INVERTER to the first input of the second NOR circuit;

means connecting the second input terminals of the first and second NOR circuits to the third terminal; and first and second switch means respectively, for selectively connecting the supply terminals of the third INVERTER and second NOR circuits to the first and second terminals for alternately energizing the third INVERTER and second NOR circuits at a frequency rate to be divided;

means for applying complementary signals to the control terminals of the first and second transmission gates so that the first transmission gate conducts when the third INVERTER is energized and the second transmission gate conducts when the second NOR is energized.

2. A resettable bistable circuit as set forth in claim 1 wherein the first switch means comprises a first pair of complementary transistors having principal current conduction paths selectively connecting the first and second supply terminals of the third INVERTER to the first and second terminals respectively and having respective control electrodes respectively responsive to separate ones of said complementary signals; and wherein the second switch means comprises a second complementary transistor pair having principal current conduction paths selectively connecting the first and second supply terminals of the second NOR circuit to the first and second terminal, respectively, responsive to separate ones of said complementary signals.

3. A resettable bistable circuit as set forth in claims 1 or 2 further comprising:

means connecting the output terminal of the first NOR circuit to the fourth terminal for arranging the bistable circuit as a frequency divider.

4. A resettable bistable binary circuit comprising a plurality of n-channel and p-channel enhancement mode field effect transistors each having drain and source electrodes and a conduction path therebetween and having gate electrodes, which transistors are connected to condition the p-channel transistors to conduct for a relatively negative potential or logic low applied to their gate electrodes and to condition the n-channel transistors to conduct for a relatively positive potential or logic high applied to their gate electrodes;

first and second terminals for applying energizing potential thereto;

third and fourth terminals for receiving receptive ones of complementary clock pulses of a frequency to be divided;

fifth and sixth terminals respectively for receiving a reset and input signal;

means connecting a first p-channel and a first n-channel transistor to form a first logical INVERTER with their respective source electrodes connected respectively to said first and second terminals, with their respective gate electrodes connected at the input terminal of said first logic INVERTER, and with their respective drain electrodes connected at the output terminal of said first logic inverter;

means connecting second p-channel and second n-channel transistors as a second logical INVERTER connected between the first and second terminals;

means connecting third p and third n-channel transistor as a third-logical INVERTER having input and output electrodes, which INVERTER connected between the first and second terminals by the respective drain-source circuits of fourth p and fourth n-channel transistors, and means connecting the respective gate electrodes of the fourth n and p transistors to the fourth and third terminals;

means connecting the input and outuput electrodes of the third INVERTER respectively to the sixth terminal and the input of the first INVERTER;

means parallel connecting the principal conduction paths of fifth and sixth n-channel transistors between the second terminal and a first node and means series connecting the principal conduction paths of fifth and sixth p-channel transistors between the first terminal and the first node, the sixth transistor most nearly connected to the first terminal, said fifth and sixth n and p-channel transistor effectively forming a first NOR circuit having an output terminal at said first node, a first input at an interconnection of the gate electrodes of the fifth n and p-channel transistors and having a second input at an interconnection of the gate electrodes of the sixth n and p-channel transistors;

means connecting the output of said first NOR to the input of the second INVERTER;

means parallel connecting the conduction paths of seventh n and p-channel transistors as a first transmission gate between the output of the second INVERTER and the first input of the first NOR circuit;

means parallel connecting the conduction paths of eighth n and p-channel transistors as a second transmission gate between the output of the first INVERTER and the first input of the first NOR circuit;

respective means connecting the gate electrodes of the seventh n-channel and eighth p-channel transistors to the fourth terminal, connecting the gate electrodes of the seventh p-channel and eighth n-channel transistor to the third terminal, and connecting the second input of the first NOR to the fifth terminal;

means parallel connecting the conduction paths of ninth and tenth n-channel transistors between a second node and the conduction path of a series connected eleventh n-channel transistor further connected to the second terminal, and means series connecting the conduction paths of ninth and tenth p-channel transistors between the second node and an interconnection of the fifth and sixth p-channel transistors; the ninth and tenth n-channel and ninth and sixth p-channel transistors forming a second effective NOR circuit with an output terminal at the second node, a first input terminal at an interconnection of the gate electrodes of ninth n and p-channel transistors and a second input terminal at an interconnection of the gate electrodes of the tenth n and sixth p-channel transistors;

respective means connecting the first input of the second NOR to the output of the first INVERTER, connecting the second input of the second NOR to the fifth terminal and connecting the output terminal of the second NOR to the input of the first INVERTER;

means connecting the gate electrodes of the tenth p and eleventh n-channel transistors to the fourth and third terminals respectively.

* * * * *